United States Patent
Hatakeyama et al.

(10) Patent No.: US 6,492,089 B2
(45) Date of Patent: Dec. 10, 2002

(54) POLYMER, RESIST COMPOSITION AND PATTERNING PROCESS

(75) Inventors: Jun Hatakeyama, Nakakubiki-gun (JP); Takeshi Kinsho, Nakakubiki-gun (JP); Mutsuo Nakashima, Nakakubiki-gun (JP); Koji Hasegawa, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/726,592

(22) Filed: Dec. 1, 2000

(65) Prior Publication Data

US 2001/0003772 A1 Jun. 14, 2001

(30) Foreign Application Priority Data

Dec. 1, 1999 (JP) .......................................... 11-342380

(51) Int. Cl.$^7$ .............................. C08F 32/08; G03F 7/38
(52) U.S. Cl. .................... 430/270.1; 430/325; 430/313; 526/279; 526/271; 528/37
(58) Field of Search .............................. 430/270.1, 325, 430/329; 526/279, 280; 528/32, 37, 40, 41

(56) References Cited

U.S. PATENT DOCUMENTS

| | | | | |
|---|---|---|---|---|
| 4,904,563 A | * | 2/1990 | Aoai et al. | 430/138 |
| 5,093,224 A | * | 3/1992 | Hashimoto et al. | 430/296 |
| 5,100,762 A | * | 3/1992 | Tanaka et al. | 430/270.1 |
| 5,886,119 A | | 3/1999 | Schaedeli et al. | |
| 6,028,154 A | | 2/2000 | Schaedeli et al. | |
| 6,042,989 A | | 3/2000 | Schaedeli et al. | |
| 2001/0003772 A1 | * | 6/2001 | Hatakeyama et al. | 526/279 |
| 2001/0031420 A1 | * | 10/2001 | Lee et al. | 430/270.1 |
| 2001/0041303 A1 | * | 11/2001 | Sato | 430/270.1 |
| 2002/0061465 A1 | * | 5/2002 | Hasegawa et al. | 430/270.1 |

FOREIGN PATENT DOCUMENTS

| | | | | | |
|---|---|---|---|---|---|
| JP | 07102216 A | * | 4/1985 | ......... | C09D/183/04 |
| JP | 7-118651 | | 5/1995 | | |
| JP | 9-110938 | | 4/1997 | | |
| WO | WO-8601219 A1 | * | 2/1986 | ........... | C08L/83/00 |

OTHER PUBLICATIONS

W. Brunsvold et al., "Evaluation of a Deep UV Bilayer Resist for Sub–Half Micron Lithography," SPIE, vol. 1925, pp. 377–387 (1993).
Carl R. Kessel et al., "Novel Silicon–Containing Resist for EUV and 193 nm Lithography," SPIE, vol. 3678, pp. 214–221 (1999).
Quinghuang LIN et al., "A High Resolution 248 nm Bilayer Resists," SPIE, vol. 3678, pp. 241–251 (1999).
Jin–Beak Kim et al., "Chemically amplified resist based on the methacrylate polymer with 2–trimethylsilyl–2–propyl ester protecting group," SPIE, vol. 3678, pp. 420–429 (1999).
Larry D. Boardman et al., "Chemical Aspects of Silicon–Containing Bilayer Resists," SPIE, vol. 3678, pp. 562–573 (1999).

* cited by examiner

*Primary Examiner*—Janet Baxter
*Assistant Examiner*—Yvette M. Clarke
(74) *Attorney, Agent, or Firm*—Millen, White, Zelano & Branigan, P.C.

(57) ABSTRACT

A polymer bearing specific cyclic silicon-containing groups is novel. A resist composition comprising the polymer as a base resin is sensitive to high-energy radiation and has excellent sensitivity and resolution at a wavelength of less than 300 nm, and high resistance to oxygen plasma etching. The resist composition lends itself to micropatterning for the fabrication of VLSIs.

19 Claims, No Drawings

POLYMER, RESIST COMPOSITION AND PATTERNING PROCESS

This invention relates to high molecular weight silicone compounds suitable as the base resin in chemically amplified positive resist compositions used for micropatterning in a process for the fabrication of semiconductor devices. It also relates to chemically amplified positive resist compositions adapted for exposure to high-energy radiation such as deep-UV, KrF excimer laser light (248 nm), ArF excimer laser light (193 nm), $F_2$ excimer laser light (157 nm), electron beams or x-rays and a process for forming a resist pattern.

BACKGROUND OF THE INVENTION

While a number of recent efforts are being made to achieve a finer pattern rule in the drive for higher integration and operating speeds in LSI devices, the commonly used light exposure technology is approaching the essential limit of resolution determined by the light source wavelength. For the light exposure using g-line (436 nm) or i-line (365 nm), a pattern rule of about 0.5 Mm is thought to be the limit. The LSI fabricated using such light exposure has a maximum degree of integration corresponding to 16 M-bit dynamic random access memory (DRAM). However, the laboratory fabrication of LSI already reached this stage, and the development of a further micropatterning technology is in urgent demand.

One means for reducing the pattern size is to reduce the wavelength of exposure light used in forming a resist pattern. For the mass production process of 256 M-bit DRAM (processing size up to 0.25 $\mu$m), it is now under intensive consideration to replace i-line (365 nm) as the exposure light source by KrF excimer laser light of a shorter wavelength of 248 nm. However, for the fabrication of DRAM with a degree of integration of 1 G or more requiring a finer patterning technology (processing size up to 0.2 $\mu$m), a shorter wavelength light source is required, and in particular, photolithography using ArF excimer laser light (193 nm) is now under investigation.

Since H. Ito, G. C. Willson et al of IBM proposed a chemically amplified positive resist composition comprising a resin in the form of polyhydroxystyrene having hydroxyl groups blocked with tert-butoxycarbonyloxy (tBOC) groups, that is, poly(4-t-butoxycarbonyloxystyrene) (PBOCST) and a photoacid generator in the form of an onium salt, a number of resist compositions having a high sensitivity and resolution have been developed. These chemically amplified positive resist compositions all have a high sensitivity and resolution, but are difficult to form fine patterns with a high aspect ratio because the patterns' mechanical strength is low.

A number of chemically amplified positive resist compositions using the above-mentioned polyhydroxystyrene as the base resin and having sensitivity to deep-UV, electron beams and x-rays are known in the art. These resist compositions, however, rely on the single-layer resist method although the bi-level resist method is advantageous in forming a pattern with a high aspect ratio on a stepped substrate. These resist compositions are not yet practically acceptable because of the outstanding problems of substrate steps, light reflection from substrates, and difficulty of forming high-aspect ratio patterns.

As is known in the art, the bi-level resist method is advantageous in forming a high-aspect ratio pattern on a stepped substrate. It is also known that in order to develop a two-layer resist film with a common alkaline developer, high molecular weight silicone compounds having hydrophilic groups such as hydroxyl and carboxyl groups must be used.

Among silicon containing chemically amplified positive resist compositions, recently proposed were those compositions comprising a base resin in the form of polyhydroxybenzylsilsesquioxane, which is a stable alkali-soluble silicone polymer, in which some phenolic hydroxyl groups are blocked with tBOC groups, in combination with a photoacid generator (see JP-A 7-118651 and SPIE vol. 1925 (1993), 377). Also JP-A 9-110938 discloses a silicon-containing polymer using a silicon-containing acrylic monomer. The silicon-containing polymer of the acrylic pendant type has the drawback that its resistance to dry etching with oxygen plasma is weak as compared with The silsesquioxane polymer. A low silicon content accounts for this weak dry etching resistance.

Then SPIE vol. 3678, pp. 214, 241 and 562 describes a polymer containing a monomer of the trisilane or tetrasilane pendant type having an increased silicon content and a silicon-containing substituent which can be eliminated with acid. However, since silane compounds of at least di-silane exhibit strong absorption at the wavelength of ArF excimer laser, an increased introduction of such silanes undesirably leads to a lower transmittance. Besides, an attempt of introducing silicon into acid labile groups is reported in SPIE vol. 3678, p. 420. Because of a low acid elimination ability, there are drawbacks including low environmental stability and a T-top profile.

SUMMARY OF THE INVENTION

An object of the invention is to provide a novel polymer which is useful as the base polymer in a chemically amplified positive resist composition having a high sensitivity and high resolution, especially suitable as a material for use in the two-layer resist method adapted to form a high-aspect ratio pattern, and capable of forming a pattern having improved heat resistance. Another object of the invention is to provide a chemically amplified positive resist composition comprising the polymer as the base resin, and a method for forming a resist pattern using the same.

We have found that by incorporating silicon-containing substituent groups of the general formula (1) or (2) to be shown below, the silicon content of a polymer can be increased to an effective level to prevent the transmittance of ArF excimer laser light from lowering. The silicon-containing substituent group of formula (1) or (2) functions as an acid-eliminatable substituent group by substituting for the hydroxyl group on a phenol or the hydroxyl moiety of a carboxyl group as shown by the general formula (3) to (8) to be shown below. This substituent group has so high an acid eliminating ability that the environmental stability following exposure is improved and a T-top profile is thus precluded. Because of at least two silicon atoms introduced in one cyclic hydrocarbon group, dry etching resistance is enhanced and glass transition temperature of polymer is increased. Because of the presence of a carbon atom or atoms between silicon atoms, no disilane bond is created and any lowering of the transmittance of ArF excimer laser light is avoided.

In a first aspect, the invention provides a polymer bearing cyclic silicon-containing groups of the following general formula (1) or (2).

(1)

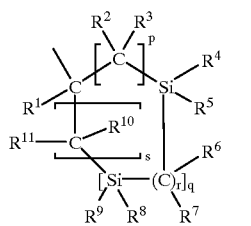

(2)

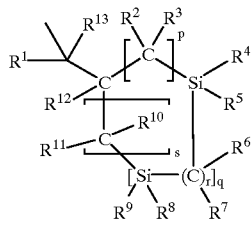

Herein $R^1$, $R^2$, $R^3$, $R^6$, $R^7$, $R^{10}$, $R^{11}$, $R^{12}$, and $R^{13}$ are independently hydrogen or straight, branched or cyclic alkyl groups of 1 to 20 carbon atoms, $R^4$, $R^5$, $R^8$, and $R^9$ are independently hydrogen, straight, branched or cyclic alkyl groups of 1 to 20 carbon atoms, fluorinated alkyl groups of 1 to 20 carbon atoms, or aryl groups of 6 to 20 carbon atoms, and p, q, r and s are integers of 0 to 10, and $1 \leq p+q+s \leq 20$.

In one preferred embodiment, the polymer contains recurring units of at least one of the following general formulas (3) to (8).

(3)

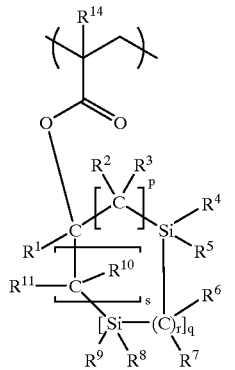

(4)

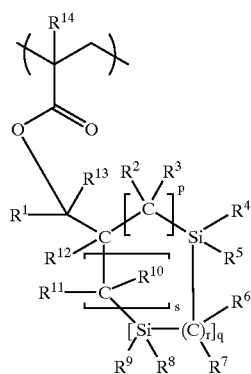

(5)

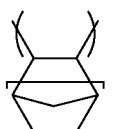

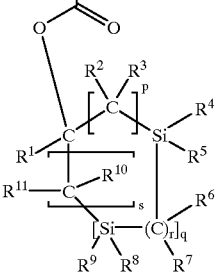

(6)

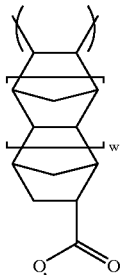

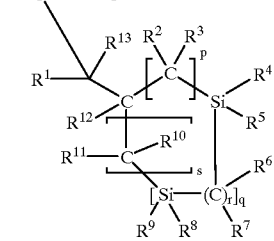

(7)

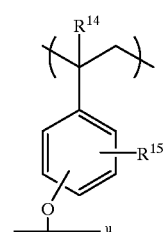

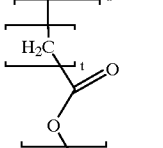

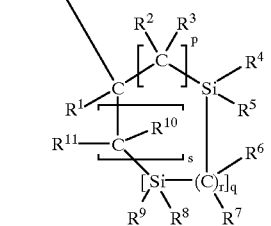

(8)

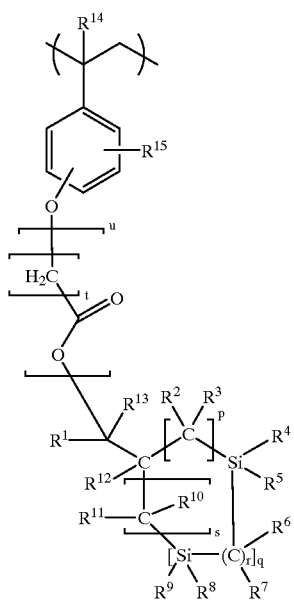

Herein $R^1$ through $R^{13}$, p, q, r and s are as defined above, $R^{14}$ is hydrogen or a straight, branched or cyclic alkyl group of 1 to 20 carbon atoms, $R^{15}$ is hydrogen or an alkyl group of 1 to 10 carbon atoms, t is a number of 0 to 5, u is equal to 0 or 1, and w is a number of 0 to 5.

In a second aspect, the invention provides a chemically amplified positive resist composition comprising (A) the above-described polymer, (B) a photoacid generator, (C) an organic solvent, and optionally, (D) a dissolution inhibitor having an acid labile group. The resist composition may further include (E) a basic compound.

In a third aspect, the invention provides a method for forming a resist pattern, comprising the steps of (1) applying the resist composition onto an organic film on a substrate and baking the composition to form a resist film, (2) irradiating radiation to the resist film through a photomask, (3) optionally baking the resist film and then developing the resist film with an aqueous base solution for dissolving the irradiated area of the resist film until the underlying organic film is exposed, thereby forming a resist pattern, and (4) processing the exposed area of the organic film with an oxygen plasma generated by a dry etching apparatus.

DESCRIPTION OF THE PREFERRED EMBODIMENT

Polymer

The polymer or high molecular weight compound of the invention contains silicon-containing groups of the following general formula (1) or (2).

(1)

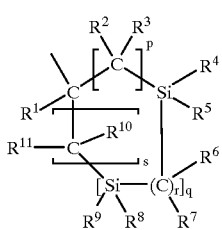

(2)

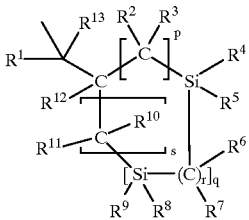

Herein $R^1$, $R^2$, $R^3$, $R^6$, $R^7$, $R^{10}$, $R^{11}$, $R^{12}$, and $R^{13}$ are independently hydrogen or straight, branched or cyclic alkyl groups of 1 to 20 carbon atoms, $R^4$, $R^5$, $R^8$, and $R^9$ are independently hydrogen, straight, branched or cyclic alkyl groups of 1 to 20 carbon atoms, fluorinated alkyl groups of 1 to 20 carbon atoms, or aryl groups of 6 to 20 carbon atoms, and p, q, r and s are integers of 0 to 10, and $1 \leq p+q+s \leq 20$.

Examples of suitable straight, branched or cyclic alkyl groups include methyl, ethyl, propyl, isopropyl, butyl, isobutyl, tert-butyl, pentyl, cyclopentyl, hexyl, cyclohexyl, octyl, decyl, dodecyl, and stearyl while those of 1 to 20 carbon atoms, and especially 1 to 10 carbon atoms are preferred. Suitable fluorinated alkyl groups include the foregoing alkyl groups in which some or all of the hydrogen atoms are replaced by fluorine atoms. Examples of suitable aryl groups include phenyl, tolyl, xylyl and naphthyl while those of 6 to 12 carbon atoms, and especially 6 to 10 carbon atoms are preferred.

The letters p, q, and s are integers of 0 to 10, and $1 \leq p+q+s \leq 20$. It is preferred that p be an integer of 0 to 8, and especially 0 to 6, q be an integer of 0 to 8, and especially 0 to 6, s be an integer of 0 to 8, and especially 0 to 6, and the sum of p+q+s be from 1 to 10, and especially 1 to 8. The letter r is an integer of 0 to 10, preferably 0 to 8, and especially 0 to 6.

The silicon-containing groups of the formula (1) or (2) can be incorporated as recurring units of the following general formulas (3) through (8). It is therefore preferred that the polymer of the invention comprise recurring units of at least one of the formulas (3) through (8).

(3)

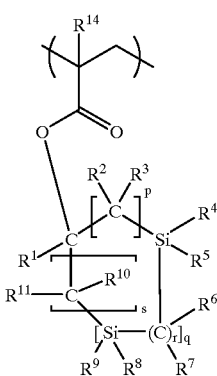

(4)
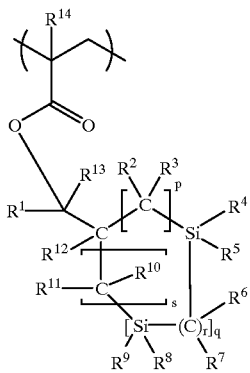

(5)
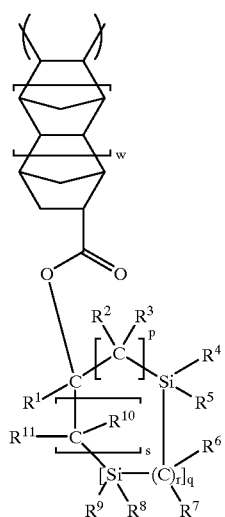

(6)
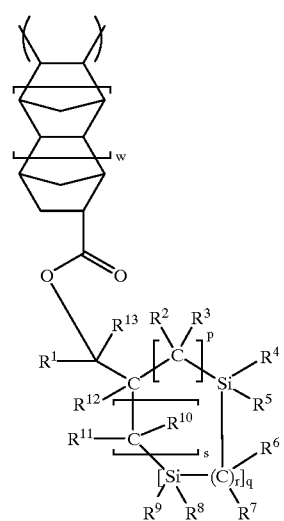

(7)
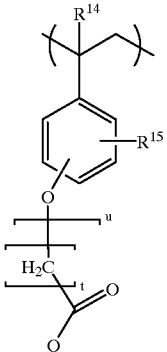

(8)
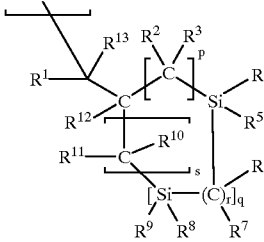

Herein $R^1$ through $R^{13}$, p, q, r and s are as defined above, $R^{14}$ is hydrogen or a straight, branched or cyclic alkyl group of 1 to 20 carbon atoms, $R^{15}$ is hydrogen or an alkyl group of 1 to 10 carbon atoms, t is a number of 0 to 5, U is equal to 0 or 1, and w is a number of 0 to 5.

Examples of the alkyl group represented by $R^{14}$ are the same as exemplified above. Preferably $R^{14}$ is hydrogen or an alkyl group of 1 to 10 carbon atoms, especially 1 to 8 carbon atoms. Examples of the alkyl group represented by $R^{15}$ are the same as exemplified above. Preferably $R^{15}$ is hydrogen or an alkyl group of 1 to 8 carbon atoms, especially 1 to 6 carbon atoms. It is preferred that t be a number of 0 to 4, and w be a number of 0 to 4, and especially 0 to 1.

Illustrative examples of the recurring units of formulas (3) through (8) are given below.

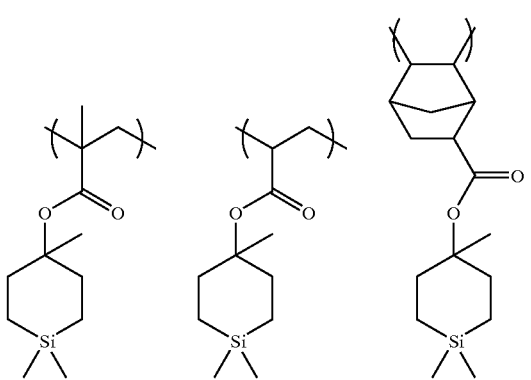
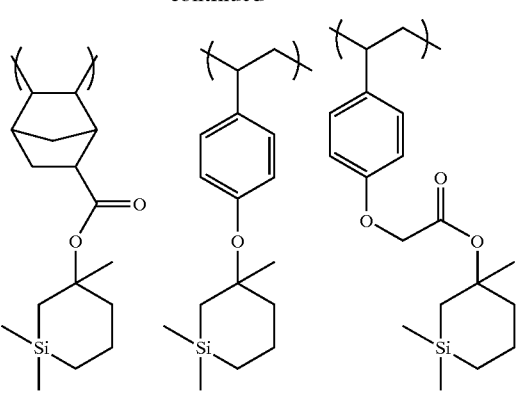
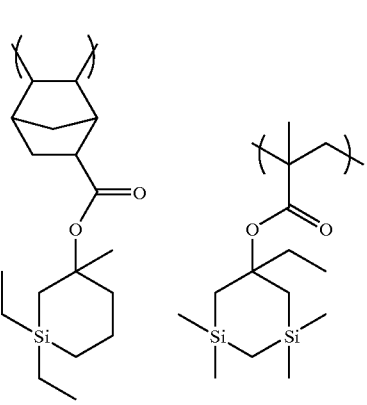
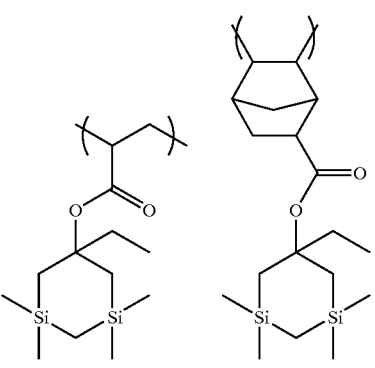
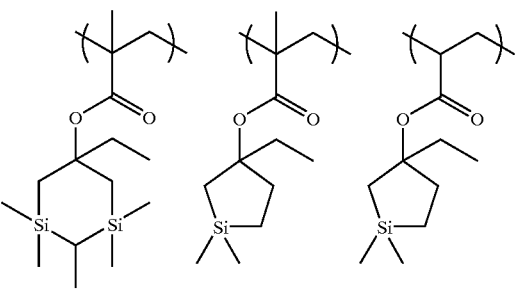

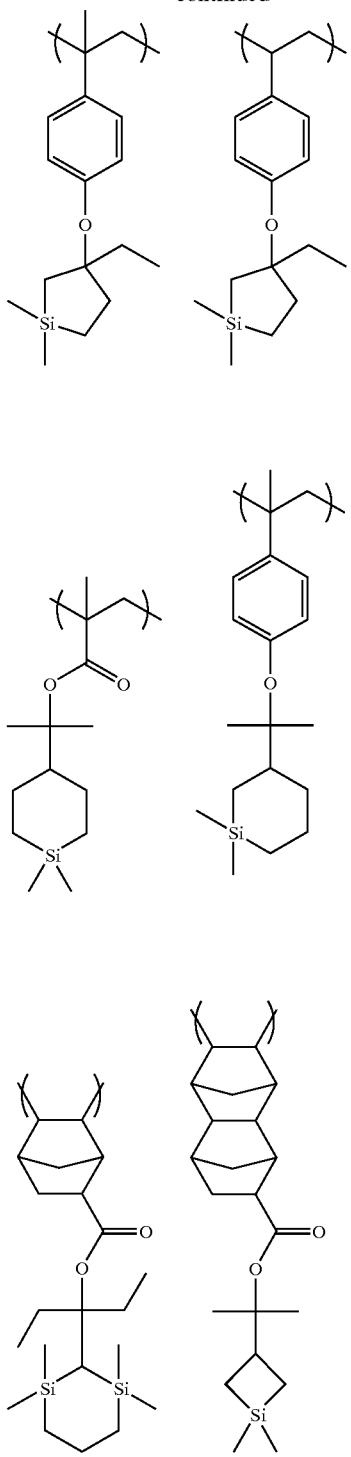

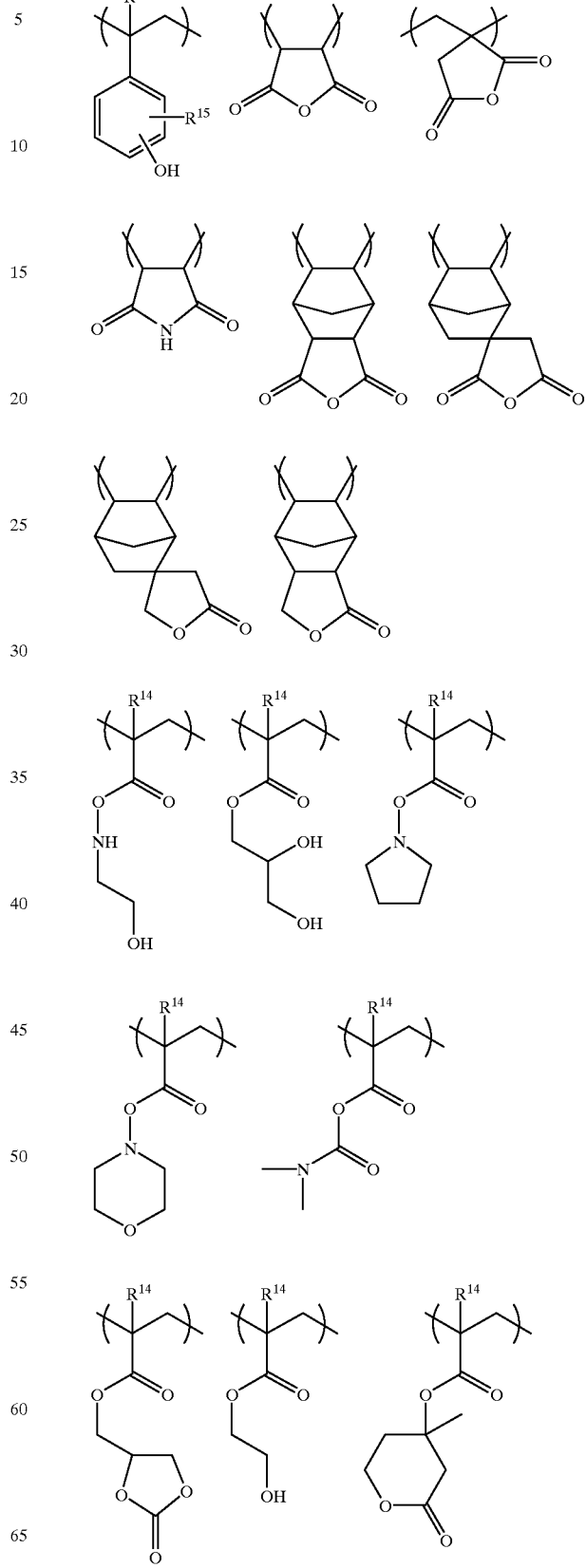

In addition to the recurring units of formulas (3) through (8), the polymer may include units of at least one type containing a substituent group for improving adhesion, and especially units of at least one type containing a hydrophilic substituent group such as hydroxystyrene, acid anhydride, ester (lactone), carbonate, alcohol, amide or ketone, which units are selected from the following Group I.

-continued

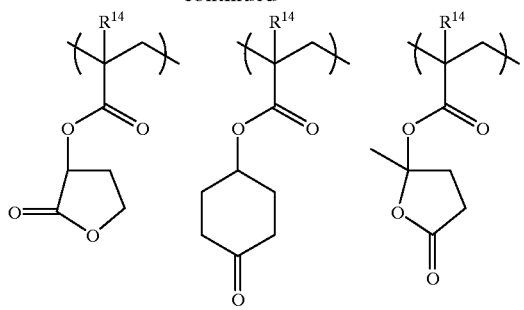

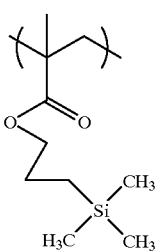

Herein $R^{14}$ and $R^{15}$ are as defined above.

The polymer preferably contains 5 to 100 mol %, more preferably 10 to 90 mol %, and most preferably 20 to 80 mol % of the units of formulas (3) through (8), with the balance being the units of the above Group I.

In the polymer, there can be further copolymerized a monomer which can increase the silicon content of the polymer to enhance its dry etching resistance. This monomer is a silicon-containing monomer, examples of which are given below.

Si-1

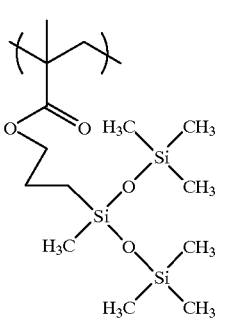

Si-2

Si-3

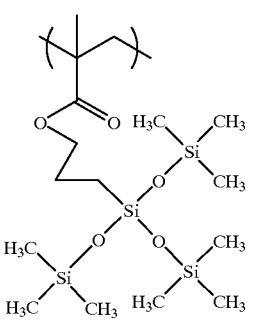

Si-4

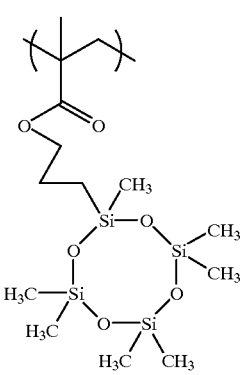

Si-5

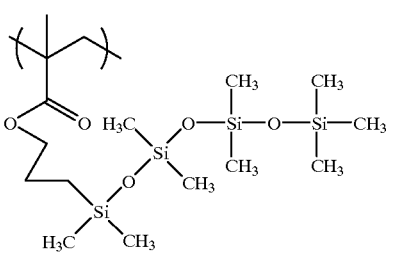

The polymer preferably has a weight average molecular weight of about 1,000 to 1,000,000, and especially about 2,000 to 100,000.

The polymer is prepared in a conventional manner by furnishing predetermined amounts of a monomer capable of forming units of the formulas (3) through (8) and optionally, a monomer capable of forming units of the above Group I, mixing the monomers in a solvent, adding a catalyst, and effecting polymerization reaction while heating or cooling if necessary. The polymerization reaction depends on the type of initiator (or catalyst), trigger means (light, heat, radiation or plasma), and polymerization conditions (including temperature, pressure, concentration, solvent and additive). Commonly used for the preparation of the inventive polymer are a radical copolymerization mode utilizing a radical of azobisisobutyronitrile (AIBN) etc. for initiating polymerization and an ionic polymerization (anionic polymerization) mode using alkyl lithium catalysts. In either mode, polymerization can be done in a conventional manner.

In order to introduce the silicon-containing substituent group of formula (1) or (2), an alcohol compound of the following formula (1a) or (1b) is subjected to esterification or similar reaction in a conventional manner, to synthesize a monomer giving units of formulas (3) to (8).

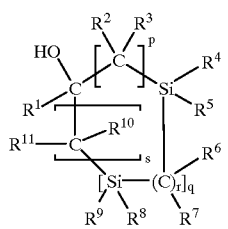

(1a)

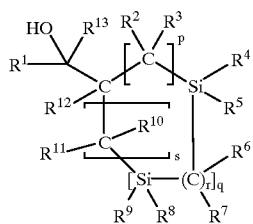

(1b)

The alcohol compound of formula (1a) or (1b) is, in turn, obtained by reacting a ketone compound of the following formula (2a) or a compound of the following formula (2b) with an organometallic reagent such as a Grignard reagent RMgX (wherein X is halogen) or an organic lithium reagent RLi.

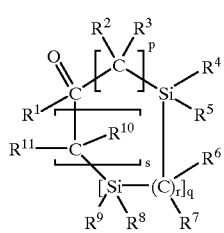

(2a)

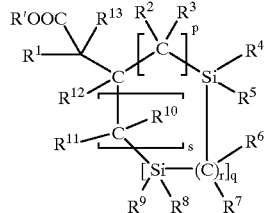

(2b)

Herein R' is an alkyl group such as methyl or ethyl.

Resist composition

The polymer of the invention is suitable as a base resin in a resist composition. A chemically amplified positive resist composition is defined herein as comprising (A) the above-described polymer as a base resin, (B) a photoacid generator, (C) an organic solvent, and optionally (D) a dissolution inhibitor having an acid labile group and (E) a basic compound.

Organic solvent (C)

The organic solvent used herein may be any organic solvent in which the base resin (the inventive polymer), photoacid generator, dissolution inhibitor and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether, 1-ethoxy-2-propanol and ethyl lactate because the photoacid generator serving as one of the resist components is most soluble therein, propylene glycol monomethyl ether acetate because it is a safe solvent, or a mixture thereof.

An appropriate amount of the organic solvent used is about 200 to 5,000 parts, especially about 400 to 3,000 parts by weight per 100 parts by weight of the base resin.

Photoacid generator (B)

Suitable examples of the photoacid generator (B) include onium salts of formula (9) below, diazomethane derivatives of formula (10) below, glyoxime derivatives of formula (11) below, β-ketosulfone derivatives, disulfone derivatives, disulfone derivatives, nitrobenzylsulfonate derivatives, sulfonic acid ester derivatives, and imidoyl sulfonate derivatives.

$$(R^{30})_b M^+ K^- \qquad (9)$$

In the formula, $R^{30}$ is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and the letter b is 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by K$^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

(10)

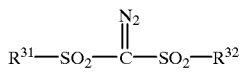

In the formula, $R^{31}$ and $R^{32}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

(11)

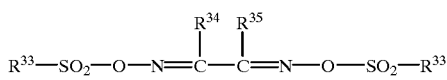

In the formula, $R^{33}$, $R^{34}$, and $R^{35}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{33}$, $R^{34}$, and $R^{35}$ are exemplified by the same groups mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include: onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenyl-sulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)-diazomethane, bis(p-toluenesulfonyl)diazomethane, bis (xylenesulfonyl)diazomethane, bis(cyclohexylsulfonyl) diazomethane, bis(cyclopentylsulfonyl)diazomethane, bis (n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris (methanesulfonyloxy)benzene, 1,2,3-tris (trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3- dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, and tris(p-tert-butoxyphenyl)sulfonium p-toluenesulfonate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-o-(p-toluenesulfonyl)-α-dimethylglyoxime and bis-o-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is added in an amount of 0.2 to 15 parts by weight, and especially 0.5 to 8 parts by weight, per 100 parts by weight of all the base resins. At less than 0.2 part, the amount of acid generated during exposure would be too low and the sensitivity and resolution are poor, whereas the addition of more than 15 parts would lower the transmittance of the resist and results in a poor resolution.

Basic compound (E)

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. (See, for example, JP-A 5-232706, JP-A 5-249683, JP-A 5-158239, JP-A 5-249662, JP-A 5-257282, JP-A 5-289322, and JP-A 5-289340).

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, aliphatic amines are especially preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formulas (12) and (13) may also be included.

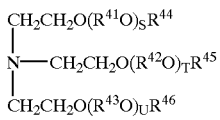
(12)

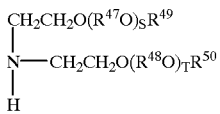
(13)

In the formulas, $R^{41}$, $R^{42}$, $R^{43}$, $R^{47}$ and $R^{48}$ are independently straight, branched or cyclic alkylenes of 1 to 20 carbon atoms; $R^{44}$, $R^{45}$, $R^{46}$, $R^{49}$ and $R^{50}$ are hydrogen, alkyls of 1 to 20 carbon atoms, or amino; $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ may bond together to form rings; and S, T and U are each integers from 0 to 20, with the proviso that hydrogen is excluded from $R^{44}$, $R^{45}$, $R^{46}$, $R^{49}$ and $R^{50}$ when S, T and U are equal to 0.

The alkylene groups represented by $R^{41}$, $R^{42}$, $R^{43}$, $R^{47}$ and $R^{48}$ preferably have 1 to 20 carbon atoms, more preferably 1 to 10 carbon atoms, and most preferably 1 to 8 carbon atoms. Examples include methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$ and $R^{50}$ preferably have 1 to 20 carbon atoms, more preferably 1 to 8 carbon atoms, and most preferably 1 to 6 carbon atoms, and may be straight, branched or cyclic. Examples include methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ with $R^{45}$ and $R^{46}$, and $R^{49}$ and $R^{50}$ form rings, the rings preferably have 1 to 20 carbon atoms, more preferably 1 to 8 carbon atoms, and most preferably 1 to 6 carbon atoms, and may have branching alkyl groups of 1 to 6 carbon atoms, and especially 1 to 4 carbon atoms.

S, T, and U are each integers from 0 to 20, preferably from 1 to 10, and more preferably from 1 to 8.

Illustrative examples of the compounds of formulas (12) and (13) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amino acid derivatives, hydroxyl group-bearing nitrogenous compounds, hydroxyphenyl group-bearing nitrogenous compounds, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

The above-described basic compound may be used singly or in combinations of two or more thereof, and is preferably formulated in an amount of 0.01 to 2 parts by weight, and especially 0.01 to 1 part by weight, per 100 parts by weight of all the base resins. At less than 0.01 part, the desired effects of the basic compound would not be apparent, while the use of more than 2 parts would result in too low a sensitivity.

Dissolution inhibitor (D)

The dissolution inhibitor (D) used herein is a compound with a molecular weight of up to 3,000 which changes its solubility in an alkaline developer under the action of an acid, and typically, a compound obtained by partially or entirely substituting acid labile substituents on a phenol or carboxylic acid derivative having a molecular weight of up to 2,500.

Examples of the phenol or carboxylic acid derivative having a molecular weight of up to 2,500 include bisphenol A, bisphenol H, bisphenol S, 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, and thimolphthalein. The acid labile substituents are the same as those exemplified above.

Illustrative, non-limiting, examples of the dissolution inhibitors which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2"-tetrahydropyranyloxy))propane, 2,2-bis(4'-(2"-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)valerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis(4'-(1"-ethoxyethoxy)phenyl)valerate, tert-butyl 4,4- bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

In the resist composition, an appropriate amount of the dissolution inhibitor is up to 20 parts by weight, and especially up to 15 parts by weight per 100 parts by weight of the solids in the composition. With more than 20 parts of the dissolution inhibitor, the resist composition becomes less heat resistant because of an increased content of monomer components.

The resist composition of the invention may include, as an optional ingredient, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, and fluorinated organosiloxane compounds. Useful surfactants are commercially available under the trade names Florade FC-430 and FC-431 from Sumitomo 3M K.K., Surflon S-141, S-145, S-381 and S-383 from Asahi Glass K.K., Unidine DS-401, DS-403 and DS-451 from Daikin Industry K.K., Megaface F-8151, F-171, F-172, F-173 and F-177 from Dai-Nippon Ink & Chemicals K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Pattern formation using the resist composition of the invention may be carried out by a known lithographic technique. For example, the resist composition is applied onto an organic film on a substrate such as a novolac film of about 0.1 to 10.0 μm thick on a silicon wafer by spin coating or the like to form a resist film having a thickness of 0.01 to 1.0 μm, which is then pre-baked on a hot plate at 60 to 200° C. for 10 seconds to 10 minutes, and preferably at 80 to 150° C. for 30 seconds to 5 minutes. A patterning mask having the desired pattern is then placed over the resist film, and the film is exposed through the mask to an electron beam or high-energy radiation having a wavelength of up to 300 nm such as deep-UV, an excimer laser, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for 30 seconds to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micropattern formation with, in particular, deep-UV rays and excimer laser light having a wavelength of 254 to 120 nm, especially ArF excimer laser of 193 nm, $F_2$ excimer laser of 157 nm, $Kr_2$ excimer laser of 146 nm, KrAr excimer laser of 134 nm, and $Ar_2$ excimer laser of 126 nm, x-rays, and an electron beam. The desired pattern may not be obtainable outside the upper and lower limits of the above range.

In the developing step, the irradiated area of the resist film is dissolved away until the underlying organic film is exposed. Then the exposed area of the organic film is conventionally processed with an oxygen plasma generated by a dry etching apparatus.

The resist composition comprising the polymer of the invention as a base resin is sensitive to high-energy radiation and has excellent sensitivity and resolution at a wavelength of less than 300 nm, and high resistance to oxygen plasma etching. Because of these advantages, the resist composition is suited for two-layer resist and easily forms a finely defined pattern having sidewalls perpendicular to the substrate. The resist composition lends itself to micropatterning for the fabrication of VLSIs.

EXAMPLE

Synthesis Examples and Examples are given below together with Comparative Examples for further illustrating the invention although the invention is not limited thereby.

Monomer Synthesis Example 1

1,4,4-trimethyl-4-silacyclohexyl Methacrylate

To a tetrahydrofuran solution of 1.0M methylmagnesium chloride under ice cooling was added dropwise 14.2 g of 4,4-dimethyl-4-silacyclohexanone (which is synthesized by the disclosure of JP-A 7-309878). After two hours of agitation, an aqueous solution of ammonium chloride was added for hydrolysis. After ordinary post-treatments including extraction, washing and concentration, the product was purified by sublimation, obtaining 14.2 g (yield 90%) of 1,4,4-trimethyl-4-silacyclohexanol.

IR νmax: 3346, 2920, 1248, 1100, 892 cm$^{-1}$ $^1$H-NMR (270 MHz, CDCl$_3$) δ: 0.00 (3H, s), 0.02 (3H, s), 0.47–0.58 (2H, m), 0.67–0.79 (2H, m), 1.17 (3H, s), 1.30 (1H, s), 1.61–1.82 (4H, m) ppm The product and 15 g of triethylamine were dissolved in 100 ml of methylene chloride. Under ice cooling, 10.5 g of methacrylic chloride was added to the solution, which was stirred for 12 hours at room temperature for esterification. Water was added to the reaction mixture. After ordinary post-treatments including extraction, washing and concentration, the product was distilled in vacuum, obtaining 15.3 g (yield 75%) of 1,4,4-trimethyl-4-silacyclohexyl methacrylate.

Boiling point: 65° C./0.8 Torr

IR νmax: 2926, 1714, 1294, 1248, 1162, 840 cm$^{-1}$ $^1$H-NMR (270 MHz, CDCl$_3$) δ: 0.00 (3H, s), 0.03 (3H, s), 0.50–0.74 (4H, m), 1.48 (3H, s), 1.51–1.64 (2H, m), 1.92 (3H, s), 2.42–2.52 (2H, m), 5.48 (1H, t), 6.04 (1H, s) ppm By similar reaction or by a conventional method, a number of polymerizable monomers were obtained as shown below.

Monomer Synthesis Example 2
1,4,4-trimethyl-4-silacyclohexyl Acrylate

Monomer Synthesis Example 3
1,4,4-trimethyl-4-silacyclohexyl 2-norbornene-5-carboxylate Monomer Synthesis Example 4
p-(1,4,4-trimethyl-4-silacyclohexyloxy)styrene Monomer Synthesis Example 5
1,4,4-trimethyl-4-silacyclohexyl p-vinylphenoxyacetate Monomer Synthesis Example 6
1-ethyl-4,4-dimethyl-4-silacyclohexyl methacrylate Monomer Synthesis Example 7
1-ethyl-4,4-dimethyl-4-silacyclohexyl 2-norbornene-5-carboxylate Monomer Synthesis Example 8
1-isopropyl-4,4-dimethyl-4-silacyclohexyl Methacrylate Monomer Synthesis Example 9
1-isopropyl-4,4-dimethyl-4-silacyclohexyl 2-norbornene-5-carboxylate Monomer Synthesis Example 10
1-isopropyl-4,4-dimethyl-4-silacyclohexyl tetracyclododecenecarboxylate Monomer Synthesis Example 11
1-ethyl-3,3-dimethyl-3-silacyclohexyl Methacrylate Monomer Synthesis Example 12
1-ethyl-3,3-dimethyl-3-silacyclohexyl Acrylate Monomer Synthesis Example 13
p-(1-ethyl-3,3-dimethyl-3-silacyclohexyloxy)styrene Monomer Synthesis Example 14
1,3,3-trimethyl-3-silacyclohexyl p-vinylphenoxyacetate Monomer Synthesis Example 15
1-ethyl-3,3-dimethyl-3-silacyclohexyl 2-norbornene-5-carboxylate Monomer Synthesis Example 16
1,3,3-triethyl-3-silacyclohexyl 2-norbornene-5-carboxylate Monomer Synthesis Example 17
1-ethyl-3,3,5,5-tetramethyl-3,5-disilacyclohexyl Methacrylate Monomer Synthesis Example 18
1-ethyl-3,3,5,5-tetramethyl-3,5-disilacyclohexyl Acrylate Monomer Synthesis Example 19
1-ethyl-3,3,5,5-tetramethyl-3,5-disilacyclohexyl 2-norbornene-5-carboxylate Monomer Synthesis Example 20
1-ethyl-3,3,4,5,5-pentamethyl-3,5-disilacyclohexyl Methacrylate Monomer Synthesis Example 21
1-ethyl-3,3,4,4,5,5-hexamethyl-3,5-disilacyclohexyl Acrylate Monomer Synthesis Example 22
1-ethyl-3,3,4,4,5,5-hexamethyl-3,5-disilacyclohexyl 2-norbornene-5-carboxylate Monomer Synthesis Example 23
1-ethyl-3,3-dimethyl-3-silacyclopentyl Methacrylate Monomer Synthesis Example 24
1-ethyl-3,3-dimethyl-3-silacyclopentyl Acrylate Monomer Synthesis Example 25
p-(1-ethyl-3,3-dimethyl-3-silacyclopentyloxy)styrene Monomer Synthesis Example 26
p-(1-ethyl-3,3-dimethyl-3-silacyclopentyloxy)-α-methylstyrene Monomer Synthesis Example 27
4,4-dimethyl-4-silacyclohexyldimethylcarbinyl Methacrylate Monomer Synthesis Example 28
p-(3,3-dimethyl-3-silacyclohexyldimethylcarbinyloxy)styrene Monomer Synthesis Example 29
2,2,6,6-tetramethyl-2,6-disilacyclohexyldiethylcarbinyl 2-norbornene-5-carboxylate Monomer Synthesis Example 30
3,3-dimethyl-3-silacyclobutyldimethylcarbinyl tetracyclododecenecarboxylate Polymer Synthesis Example 1

Synthesis of 1,4,4-trimethyl-4-silacyclohexyl methacrylate/5-oxo-4-oxatricyclo-[4.2.1.0$^{3,7}$]nonan-2-yl Methacrylate (7:3) Copolymer In a 2-liter flask, 70 g of 1,4,4-trimethyl-4-silacyclohexyl methacrylate and 35 g of 5-oxo-4-oxatricyclo-[4.2.1.0$^{3,7}$]nonan-2-yl methacrylate were dissolved in 560 ml of toluene. After thorough purging of oxygen from the system, 5.5 g of an initiator AIBN was added to the system, which was heated at 60° C. whereupon polymerization reaction took place for 24 hours.

To work up the polymer, the reaction mixture was poured into a mixture of hexane and ether (3:2) whereupon the precipitating polymer was separated. There was obtained 97 g of the white polymer which was a copolymer of 1,4,4-trimethyl-4-silacyclohexyl methacrylate and 5-oxo-oxatricyclo[4.2.1.0$^{3,7}$]nonan-2-yl methacrylate (7:3).

The white polymer, 1,4,4-trimethyl-4-silacyclohexyl methacrylate/5-oxo-oxatricyclo[4.2.1.0$^{3,7}$]nonan-2-yl methacrylate (7:3) copolymer was confirmed by the light scattering method to have a weight average molecular weight of 9,800 g/mol and by the GPC elution curve to have a dispersity (Mw/Mn) of 1.60. By $^1$H-NMR analysis, the copolymer was found to contain the two components in a ratio of approximately 7:3.

Polymer Synthesis Example 2

Synthesis of 1,4,4-trimethyl-4-silacyclohexyl acrylate/5-oxo-4-oxatricyclo[4.2.1.0$^{3,7}$]nonan-2-yl Acrylate (7:3) Copolymer A copolymer was synthesized as in Polymer Synthesis Example 1, using 1,4,4-trimethyl-4-silacyclohexyl acrylate instead of 1,4,4-trimethyl-4-silacyclohexyl methacrylate. The polymer was confirmed by the light scattering method to have a weight average molecular weight of 12,000 g/mol and by the GPC elution curve to have a dispersity (Mw/Mn) of 1.60. By $^1$H-NMR analysis, the copolymer was found to contain the two components in a ratio of approximately 7:3.

Polymer Synthesis Example 3

Synthesis of 1,4,4-trimethyl-4-silacyclohexyl 2-norbornene-5-carboxylate/maleic Anhydride (5:5) Copolymer In a 2-liter flask, 70 g of 1,4,4-trimethyl-4-silacyclohexyl 2-norbornene-5-carboxylate and 30 g of maleic anhydride were dissolved in 560 ml of toluene. After thorough purging of oxygen from the system, 5.5 g of an initiator AIBN was added to the system, which was heated at 60° C. whereupon polymerization reaction took place for 24 hours. A similar subsequent procedure yielded a poly(1,4,4-trimethyl-4-silacyclohexyl 2-norbornene-5-carboxylate)/poly(maleic anhydride) (5:5) copolymer. It was confirmed by the light scattering method to have a weight average molecular weight of 7,000 g/mol and by the GPC elution curve to have a dispersity (Mw/Mn) of 1.50. By $^1$H-NMR analysis, the copolymer was found to contain the two components in a ratio of approximately 5:5.

Polymer Synthesis Example 4

Synthesis of p-(1,4,4-trimethyl-4-silacyclohexyloxy)styrene/hydroxystyrene (3:7) Copolymer In a 2-liter flask, 30 g of p-(1,4,4-trimethyl-4-silacyclohexyloxy)styrene and 45 g of acetoxystyrene were dissolved in 560 ml of toluene. After thorough purging of oxygen from the system, 5.5 g of an initiator AIBN was added to the system, which was heated at 60° C. whereupon polymerization reaction took place for 24 hours. A similar subsequent procedure yielded a p-(1,4,4-trimethyl-4-silacyclohexyloxy)styrene/hydroxystyrene (3:7) copolymer. This polymer was transferred to a 3-liter flask where it was dissolved in 500 g of methanol and 400 g of acetone. 97 g of triethylamine and 50 g of pure water were added to the solution, which was heated at 60° C. whereupon hydrolysis reaction took place for 20 hours.

The reaction solution was concentrated and poured into 20 liters of pure water having 150 g of acetic acid dissolved therein, whereupon a polymer precipitated. The purifying procedure involving dissolving the polymer in acetone and pouring into 20 liters of pure water for precipitation was repeated twice. The polymer was then separated and dried. The polymer was confirmed by the light scattering method to have a weight average molecular weight of 13,000 g/mol and by the GPC elution curve to have a dispersity (Mw/Mn) of 1.70. By $^1$H-NMR analysis, the copolymer was found to contain the two components in a ratio of approximately 3:7.

Polymer Synthesis Example 5

Synthesis of 1,4,4-trimethyl-4-silacyclohexylhydroxystyrene p-vinylphenoxyacetate/hydroxystyrene (3:7) Copolymer A copolymer was synthesized as in Polymer Synthesis Example 4 except that 1,4,4-trimethyl-4-silacyclohexylhydroxystyrene p-vinylphenoxyacetate was used instead of p-(1,4,4-trimethyl-4-silacyclohexyloxy)styrene. The polymer was confirmed by the light scattering method to have a weight average molecular weight of 13,000 g/mol and by the GPC elution curve to have a dispersity (Mw/Mn) of 1.70. By $^1$H-NMR analysis, the copolymer was found to contain the two components in a ratio of approximately 3:7.

Polymer Synthesis Example 6

Synthesis of 1-ethyl-4,4-dimethyl-4-silacyclohexyl methacrylate/5-oxo-oxatricyclo-[4.2.1.0$^{3,7}$]nonan-2-yl Methacrylate (7:3) Copolymer A copolymer was synthesized as in Polymer Synthesis Example 1 except that 1-ethyl-4,4-dimethyl-4-silacyclohexyl methacrylate was used instead of 1,4,4-trimethyl-4-silacyclohexyl methacrylate. The polymer was confirmed by the light scattering method to have a weight average molecular weight of 12,000 g/mol and by the GPC elution curve to have a dispersity (Mw/Mn) of 1.50. By $^1$H-NMR analysis, the copolymer was found to contain the two components in a ratio of approximately 7:3.

Polymer Synthesis Example 7

Synthesis of 1-ethyl-4,4-dimethyl-4-silacyclohexyl 2-norbornene-5-carboxylate/maleic Anhydride (5:5) Copolymer A copolymer was synthesized as in Polymer Synthesis Example 3 except that 1-ethyl-4,4-dimethyl-4-silacyclohexyl 2-norbornene-5-carboxylate was used instead of 1,4,4-trimethyl-4-silacyclohexyl 2-norbornene-5-carboxylate. The polymer was confirmed by the light scattering method to have a weight average molecular weight of 8,000 g/mol and by the GPC elution curve to have a dispersity (Mw/Mn) of 1.60. By $^1$H-NMR analysis, the copolymer was found to contain the two components in a ratio of approximately 7:3.

Polymer Synthesis Example 8

Synthesis of 1-isopropyl-4,4-dimethyl-4-silacyclohexyl methacrylate/5-oxo-oxatricyclo-[4.2.1.0$^{3,7}$]nonan-2-yl Methacrylate (7:3) Copolymer A copolymer was synthesized as in Polymer Synthesis Example 1 except that 1-isopropyl-4,4-dimethyl-4-silacyclohexyl methacrylate was used instead of 1,4,4-trimethyl-4-silacyclohexyl methacrylate. The polymer was confirmed by the light scattering method to have a weight average molecular weight of 14,000 g/mol and by the GPC elution curve to have a dispersity (Mw/Mn) of 1.65. By $^1$H-NMR analysis, the copolymer was found to contain the two components in a ratio of approximately 7:3.

Polymer Synthesis Example 9

Synthesis of 1-isopropyl-4,4-dimethyl-4-silacyclohexyl 2-norbornene-5-carboxylate/maleic Anhydride (5:5) Copolymer A copolymer was synthesized as in Polymer Synthesis Example 3 except that 1-isopropyl-4,4-dimethyl-4-silacyclohexyl 2-norbornene-5-carboxylate was used instead of 1,4,4-trimethyl-4-silacyclohexyl 2-norbornene-5-carboxylate. The polymer was confirmed by the light scattering method to have a weight average molecular weight of 7,000 g/mol and by the GPC elution curve to have a dispersity (Mw/Mn) of 1.70. By $^1$H-NMR analysis, the copolymer was found to contain the two components in a ratio of approximately 5:5.

Polymer Synthesis Example 10

Synthesis of 1-isopropyl-4,4-dimethyl-4-silacyclohexyl tetracyclododecenecarboxylate/maleic Anhydride (5:5) Copolymer A copolymer was synthesized as in Polymer Synthesis Example 3 except that 1-isopropyl-4,4-dimethyl-4-silacyclohexyl tetracyclododecenecarboxylate was used instead of 1,4,4-trimethyl-4-silacyclohexyl 2-norbornene-5-carboxylate. The polymer was confirmed by the light scattering method to have a weight average molecular weight of 4,000 g/mol and by the GPC elution curve to have a dispersity (Mw/Mn) of 1.90. By $^1$H-NMR analysis, the copolymer was found to contain the two components in a ratio of approximately 5:5.

Polymer Synthesis Example 11

Synthesis of 1-ethyl-3,3-dimethyl-3-silacyclohexyl methacrylate/5-oxo-4-oxatricyclo-[4.2.1.0$^{3,7}$]nonan-2-yl Methacrylate (7:3) Copolymer A copolymer was synthesized as in Polymer Synthesis Example 1 except that 1-ethyl-3,3-dimethyl-3-silacyclohexyl methacrylate was used instead of 1,4,4-trimethyl-4-silacyclohexyl methacrylate. The polymer was confirmed by the light scattering method to have a weight average molecular weight of 11,200 g/mol and by the GPC elution curve to have a dispersity (Mw/Mn) of 1.65. By $^1$H-NMR analysis, the copolymer was found to contain the two components in a ratio of approximately 7:3.

Polymer Synthesis Example 12

Synthesis of 1-ethyl-3,3-dimethyl-3-silacyclohexyl acrylate/5-oxo-4-oxatricyclo-[4.2.1.0$^{3,7}$]nonan-2-yl Methacrylate (7:3) Copolymer A copolymer was synthesized as in Polymer Synthesis Example 1 except that 1-ethyl-3,3-dimethyl-3-silacyclohexyl acrylate was used instead of 1,4,4-trimethyl-4-silacyclohexyl methacrylate. The polymer was confirmed by the light scattering method to have a weight average molecular weight of 13,000 g/mol and by the GPC elution curve to have a dispersity (Mw/Mn) of 1.75. By $^1$H-NMR analysis, the copolymer was found to contain the two components in a ratio of approximately 7:3.

Polymer Synthesis Example 13

Synthesis of p-(1-ethyl-3,3-dimethyl-3-silacyclohexyloxy)styrene/hydroxystyrene (3:7) Copolymer A copolymer was synthesized as in Polymer Synthesis Example 4 except that p-(1-ethyl-3,3-dimethyl-3-silacyclohexyloxy)styrene was used instead of p-(1,4,4-trimethyl-4-silacyclohexyloxy)styrene. The polymer was confirmed by the light scattering method to have a weight average molecular weight of 11,500 g/mol and by the GPC elution curve to have a dispersity (Mw/Mn) of 1.65. By $^1$H-NMR analysis, the copolymer was found to contain the two components in a ratio of approximately 3:7.

Polymer Synthesis Example 14

Synthesis of 1,3,3-trimethyl-3-silacyclohexyl p-vinylphenoxyacetate/hydroxystyrene (3:7) Copolymer A copolymer was synthesized as in Polymer Synthesis Example 4 except that 1,3,3-trimethyl-3-silacyclohexyl p-vinylphenoxyacetate was used instead of p-(1,4,4-trimethyl-4-silacyclohexyloxy)styrene. The polymer was confirmed by the light scattering method to have a weight average molecular weight of 13,200 g/mol and by the GPC elution curve to have a dispersity (Mw/Mn) of 1.68. By $^1$H-NMR analysis, the copolymer was found to contain the two components in a ratio of approximately 3:7.

Polymer Synthesis Example 15

Synthesis of 1-ethyl-3,3-dimethyl-3-silacyclohexyl 2-norbornene-5-carboxylate/maleic Anhydride (5:5) Copolymer A copolymer was synthesized as in Polymer Synthesis Example 3 except that 1-ethyl-3,3-dimethyl-3-silacyclohexyl 2-norbornene-5-carboxylate was used instead of 1,4,4-trimethyl-4-silacyclohexyl 2-norbornene-5-carboxylate. The polymer was confirmed by the light scattering method to have a weight average molecular weight of 7,000 g/mol and by the GPC elution curve to have a dispersity (Mw/Mn) of 1.70. By $^1$H-NMR analysis, the copolymer was found to contain the two components in a ratio of approximately 5:5.

Polymer Synthesis Example 16

Synthesis of 1,3,3-triethyl-3-silacyclohexyl 2-norbornene-5-carboxylate/maleic Anhydride (5:5) Copolymer A copolymer was synthesized as in Polymer Synthesis Example 3 except that 1,3,3-triethyl-3-silacyclohexyl 2-norbornene-5-carboxylate was used instead of 1,4,4-trimethyl-4-silacyclohexyl 2-norbornene-5-carboxylate. The polymer was confirmed by the light scattering method to have a weight average molecular weight of 8,000 g/mol and by the GPC elution curve to have a dispersity (Mw/Mn) of 1.80. By $^1$H-NMR analysis, the copolymer was found to contain the two components in a ratio of approximately 5:5.

Polymer Synthesis Example 17

Synthesis of 1-ethyl-3,3,5,5-tetramethyl-3,5-disilacyclohexyl methacrylate/5-oxo-4-oxatricyclo [4.2.1.0$^{3,7}$]nonan-2-yl Methacrylate (7:3) Copolymer A copolymer was synthesized as in Polymer Synthesis Example 1 except that 1-ethyl-3,3,5,5-tetramethyl-3,5-disilacyclohexyl methacrylate was used instead of 1,4,4-trimethyl-4-silacyclohexyl methacrylate. The polymer was confirmed by the light scattering method to have a weight average molecular weight of 13,000 g/mol and by the GPC elution curve to have a dispersity (Mw/Mn) of 1.77. By $^1$H-NMR analysis, the copolymer was found to contain the two components in a ratio of approximately 7:3.

Polymer Synthesis Example 18

Synthesis of 1-ethyl-3,3,5,5-tetramethyl-3,5-disilacyclohexyl acrylate/5-oxo-4-oxatricyclo [4.2.1.0$^{3,7}$]nonan-2-yl Methacrylate (7:3) Copolymer A copolymer was synthesized as in Polymer Synthesis Example 1 except that 1-ethyl-3,3,5,5-tetramethyl-3,5-disilacyclohexyl acrylate was used instead of 1,4,4-trimethyl-4-silacyclohexyl methacrylate. The polymer was confirmed by the light scattering method to have a weight average molecular weight of 12,000 g/mol and by the GPC elution curve to have a dispersity (Mw/Mn) of 1.60. By $^1$H-NMR analysis, the copolymer was found to contain the two components in a ratio of approximately 7:3.

Polymer Synthesis Example 19

Synthesis of 1-ethyl-3,3,5,5-tetramethyl-3,5-disilacyclohexyl 2-norbornene-5-carboxylate/maleic Anhydride (5:5) Copolymer A copolymer was synthesized as in Polymer Synthesis Example 3 except that 1-ethyl-3,3,5,5-tetramethyl-3,5-disilacyclohexyl 2-norbornene-5-carboxylate was used instead of 1,4,4-trimethyl-4-silacyclohexyl 2-norbornene-5-carboxylate. The polymer was confirmed by the light scattering method to have a weight average molecular weight of 8,000 g/mol and by the GPC elution curve to have a dispersity (Mw/Mn) of 1.80. By $^1$H-NMR analysis, the copolymer was found to contain the two components in a ratio of approximately 5:5.

Polymer Synthesis Example 20

Synthesis of 1-ethyl-3,3,4,5,5-pentamethyl-3,5-disilacyclohexyl methacrylate/5-oxo-4-oxatricyclo [4.2.1.0$^{3,7}$]nonan-2-yl Methacrylate (7:3) Copolymer A copolymer was synthesized as in Polymer Synthesis Example 1 except that 1-ethyl-3,3,4,5,5-pentamethyl-3,5-disilacyclohexyl methacrylate was used instead of 1,4,4-trimethyl-4-silacyclohexyl methacrylate. The polymer was confirmed by the light scattering method to have a weight average molecular weight of 13,000 g/mol and by the GPC elution curve to have a dispersity (Mw/Mn) of 1.58. By 1H-NMR analysis, the copolymer was found to contain the two components in a ratio of approximately 7:3.

Polymer Synthesis Example 21

Synthesis of 1-ethyl-3,3,4,4,5,5-hexamethyl-3,5-disilacyclohexyl Acrylate/5-oxo-4-oxatricyclo [4.2.1.0$^{3,7}$]nonan-2-yl Methacrylate (7:3) Copolymer A copolymer was synthesized as in Polymer Synthesis Example 1 except that 1-ethyl-3,3,4,4,5,5-hexamethyl-3,5-disilacyclohexyl acrylate was used instead of 1,4,4-trimethyl-4-silacyclohexyl methacrylate. The polymer was confirmed by the light scattering method to have a weight average molecular weight of 11,200 g/mol and by the GPC elution curve to have a dispersity (Mw/Mn) of 1.78. By $^1$H-NMR analysis, the copolymer was found to contain the two components in a ratio of approximately 7:3.

Polymer Synthesis Example 22

Synthesis of 1-ethyl-3,3,4,4,5,5-hexamethyl-3,5-disilacyclohexyl 2-norbornene-5-carboxylate/maleic Anhydride (5:5) Copolymer A copolymer was synthesized as in Polymer Synthesis Example 3 except that 1-ethyl-3,3,4,4,5,5-hexamethyl-3,5-disilacyclohexyl 2-norbornene-5-carboxylate was used instead of 1,4,4-trimethyl-4-silacyclohexyl 2-norbornene-5-carboxylate. The polymer was confirmed by the light scattering method to have a weight average molecular weight of 7,500 g/mol and by the GPC elution curve to have a dispersity (Mw/Mn) of 1.88. By $^1$H-NMR analysis, the copolymer was found to contain the two components in a ratio of approximately 5:5.

Polymer Synthesis Example 23

Synthesis of 1-ethyl-3,3-dimethyl-3-silacyclopentyl methacrylate/5-oxo-4-oxatricyclo-[4.2.1.0$^{3,7}$]nonan-2-yl Methacrylate (7:3) Copolymer A copolymer was synthesized as in Polymer Synthesis Example 1 except that 1-ethyl-3,3-dimethyl-3-silacyclopentyl methacrylate was used instead of 1,4,4-trimethyl-4-silacyclohexyl methacrylate. The polymer was confirmed by the light scattering method to have a weight average molecular weight of 12,000 g/mol and by the GPC elution curve to have a dispersity (Mw/Mn) of 1.72. By $^1$H-NMR analysis, the copolymer was found to contain the two components in a ratio of approximately 7:3.

Polymer Synthesis Example 24

Synthesis of 1-ethyl-3,3-dimethyl-3-silacyclopentyl acrylate/5-oxo-oxatricyclo-[4.2.1.0$^{3,7}$]nonan-2-yl Methacrylate (7:3) Copolymer A copolymer was synthesized as in Polymer Synthesis Example 1 except that 1-ethyl-3,3-dimethyl-3-silacyclopentyl acrylate was used instead of 1,4,4-trimethyl-4-silacyclohexyl methacrylate. The polymer was confirmed by the light scattering method to have a weight average molecular weight of 13,200 g/mol and by the GPC elution curve to have a dispersity (Mw/Mn) of 1.85. By $^1$H-NMR analysis, the copolymer was found to contain the two components in a ratio of approximately 7:3.

Polymer Synthesis Example 25

Synthesis of p-(1-ethyl-3,3-dimethyl-3-silacyclopentyloxy)styrene/hydroxystyrene (3:7) Copolymer A copolymer was synthesized as in Polymer Synthesis Example 4 except that p-(1-ethyl-3,3-dimethyl-3-silacyclopentyloxy)styrene was used instead of p-(1,4,4-trimethyl-4-silacyclohexyloxy)styrene. The polymer was confirmed by the light scattering method to have a weight average molecular weight of 11,000 g/mol and by the GPC elution curve to have a dispersity (Mw/Mn) of 1.56. By $^1$H-NMR analysis, the copolymer was found to contain the two components in a ratio of approximately 3:7.

Polymer Synthesis Example 26

Synthesis of p-(l-ethyl-3,3-dimethyl-3-silacyclopentyloxy)-α-methylstyrene/ hydroxystyrene (3:7) Copolymer A copolymer was synthesized as in Polymer Synthesis Example 4 except that p-(1-ethyl-3,3-dimethyl-3-silacyclopentyloxy)-α-methylstyrene was used instead of p-(1,4,4-trimethyl-4-silacyclohexyloxy)styrene. The polymer was confirmed by the light scattering method to have a weight average molecular weight of 11,000 g/mol and by the GPC elution curve to have a dispersity (Mw/Mn) of 1.50. By $^1$H-NMR analysis, the copolymer was found to contain the two components in a ratio of approximately 3:7.

Polymer Synthesis Example 27

Synthesis of 4,4-dimethyl-4-silacyclohexyldimethylcarbinyl methacrylate/5-oxo-oxatricyclo[4.2.1.0$^{3,7}$]nonan-2-yl Methacrylate (7:3) Copolymer A copolymer was synthesized as in Polymer Synthesis Example 1 except that 4,4-dimethyl-4- silacyclohexyldimethylcarbinyl methacrylate was used instead of 1,4,4-trimethyl-4-silacyclohexyl methacrylate. The polymer was confirmed by the light scattering method to have a weight average molecular weight of 13,200 g/mol and by the GPC elution curve to have a dispersity (Mw/Mn) of 1.85. By $^1$H-NMR analysis, the copolymer was found to contain the two components in a ratio of approximately 7:3.

Polymer Synthesis Example 28

Synthesis of p-(3,3-dimethyl-3-silacyclohexyldimethylcarbinyloxy)styrene/ hydroxystyrene (3:7) Copolymer A copolymer was synthesized as in Polymer Synthesis Example 4 except that p-(3,3-dimethyl-3-silacyclohexyldimethylcarbinyloxy)styrene was used instead of p-(1,4,4-trimethyl-4-silacyclohexyloxy)styrene. The polymer was confirmed by the light scattering method to have a weight average molecular weight of 10,800 g/mol and by the GPC elution curve to have a dispersity (Mw/Mn) of 1.66. By $^1$H-NMR analysis, the copolymer was found to contain the two components in a ratio of approximately 3:7.

Polymer Synthesis Example 29

Synthesis of 2,2,6,6-tetramethyl-2,6-disilacyclohexyldiethylcarbinyl 2-norbornene-5-carboxylate/maleic Anhydride (5:5) Copolymer A copolymer was synthesized as in Polymer Synthesis Example 3 except that 2,2,6,6-tetramethyl-2,6-disilacyclohexyldiethylcarbinyl 2-norbornene-5-carboxylate was used instead of 1,4,4-trimethyl-4-silacyclohexyl 2-norbornene-5-carboxylate. The polymer was confirmed by the light scattering method to have a weight average molecular weight of 7,700 g/mol and by the GPC elution curve to have a dispersity (Mw/Mn) of 1.78. By $^1$H-NMR analysis, the copolymer was found to contain the two components in a ratio of approximately 5:5.

Polymer Synthesis Example 30

Synthesis of 3,3-dimethyl-3-silacyclobutyldimethylcarbinyl tetracyclododecene-carboxylate/maleic Anhydride (5:5) Copolymer A copolymer was synthesized as in Polymer Synthesis Example 3 except that 3,3-dimethyl-3-silacyclobutyldimethylcarbinyl tetracyclododecenecarboxylate was used instead of 1,4,4-trimethyl-4-silacyclohexyl 2-norbornene-5-carboxylate. The polymer was confirmed by the light scattering method to have a weight average molecular weight of 3,200 g/mol and by the GPC elution curve to have a dispersity (Mw/Mn) of 1.92. By $^1$H-NMR analysis, the copolymer was found to contain the two components in a ratio of approximately 5:5.

Comparative Polymer Synthesis Example 1

Synthesis of tris(trimethylsilyl)silylethyl methacrylate/5-oxo-4-oxatricyclo[4.2.1.0$^{3,7}$]nonan-2-yl Methacrylate (7:3) Copolymer A copolymer was synthesized as in Polymer Synthesis Example 1 except that tris(trimethylsilyl)silylethyl methacrylate was used instead of 1,4,4-trimethyl-4-silacyclohexyl methacrylate. The polymer was confirmed by the light scattering method to have a weight average molecular weight of 11,000 g/mol and by the GPC elution curve to have a dispersity (Mw/Mn) of 1.65. By $^1$H-NMR analysis, the copolymer was found to contain the two components in a ratio of approximately 7:3.

Comparative Polymer Synthesis Example 2

Synthesis of 3-[tris(trimethylsilyloxy)silyl]propyl methacrylate/t-butyl methacrylate/5-oxo-4-oxatricyclo[4.2.1.0$^{3,7}$]nonan-2-yl Methacrylate (2:5:3) Copolymer A copolymer was synthesized as in Polymer Synthesis Example 1 except that 3-[tris(trimethylsilyloxy)silyl]propyl methacrylate and t-butyl methacrylate were used instead of 1,4,4-trimethyl-4-silacyclohexyl methacrylate. The polymer was confirmed by the light scattering method to have a weight average molecular weight of 13,000 g/mol and by the GPC elution curve to have a dispersity (Mw/Mn) of 1.78. By $^1$H-NMR analysis, the copolymer was found to contain the components in a ratio of approximately 2:5:3.

Examples and Comparative Examples

A polymer solution was prepared by dissolving 1 part by weight of each of the silicone polymers in the above Polymer Synthesis Examples in 10 parts by weight of propylene glycol monomethyl ether acetate (PGMEA) containing 0.01% by weight of surfactant Florade FC-430 (Sumitomo 3M), followed by filtration through a 0.1 μm Teflon filter.

The polymer solution was applied onto a quartz substrate and baked at 100° C. for 60 seconds to form a film of 0.2 μm thick. Using a spectrophotometer, the film was measured for transmittance at a wavelength of 193 nm and 248 nm. The results are shown in Table 1.

TABLE 1

Polymers' transmittance

| Polymer | Transmittance (%) | |
|---|---|---|
| | 193 nm | 248 nm |
| Polymer of SE 1 | 85 | 95 |
| Polymer of SE 2 | 90 | 95 |
| Polymer of SE 3 | 81 | 90 |
| Polymer of SE 6 | 86 | 93 |
| Polymer of SE 7 | 82 | 92 |
| Polymer of SE 8 | 84 | 95 |
| Polymer of SE 9 | 82 | 92 |
| Polymer of SE 10 | 78 | 92 |
| Polymer of SE 11 | 83 | 94 |
| Polymer of SE 12 | 85 | 96 |
| Polymer of SE 15 | 79 | 94 |
| Polymer of SE 16 | 80 | 96 |
| Polymer of SE 17 | 88 | 96 |
| Polymer of SE 18 | 87 | 97 |
| Polymer of SE 19 | 81 | 91 |
| Polymer of SE 20 | 87 | 95 |
| Polymer of SE 21 | 88 | 95 |
| Polymer of SE 22 | 81 | 94 |
| Polymer of SE 23 | 84 | 96 |
| Polymer of SE 24 | 89 | 95 |
| Polymer of SE 27 | 84 | 94 |
| Polymer of SE 29 | 78 | 92 |
| Polymer of SE 30 | 74 | 91 |
| Polymer of CSE 1 | 5 | 91 |
| Polymer of CSE 2 | 89 | 98 |

Note that Synthesis Example and Comparative Synthesis Example are abbreviated as SE and CSE, respectively.

Note that Synthesis Example and Comparative Synthesis Example are abbreviated as SE and CSE, respectively.

Next, a novolac resin solution was prepared as a lower layer material by dissolving 10 parts by weight of a cresol novolac resin having a m/p ratio of 6/4 and a Mw of 10,000 in 60 parts by weight of propylene glycol monomethyl ether acetate (PGMEA). The novolac resin solution was spin coated onto a silicon wafer and heat cured at 300° C. for 5 minutes into a lower layer of 0.5 μm thick. DUV-30 (Brewer Science) was spin coated onto the lower layer and baked at 100° C. for 30 seconds and then at 200° C. for 60 seconds, forming an intermediate film.

A resist solution was prepared by dissolving each of the silicone polymers in the above Polymer Synthesis Examples, a photoacid generator (designated as PAG1 or PAG2), a basic compound (tributylamine or TMMEA), and a dissolution inhibitor (designated as DRI1) in PGMEA containing 0.01% by weight of surfactant Florade FC-430 (Sumitomo 3M), followed by filtration through a 0.1 μm Teflon filter.

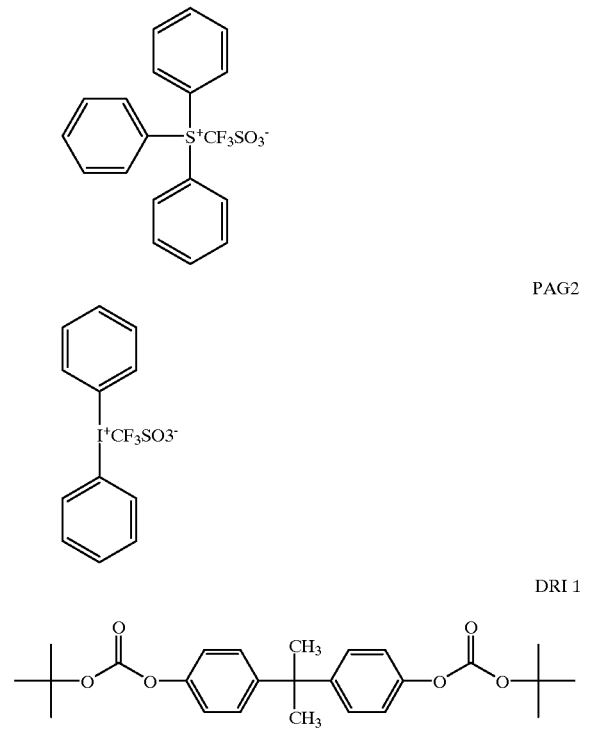

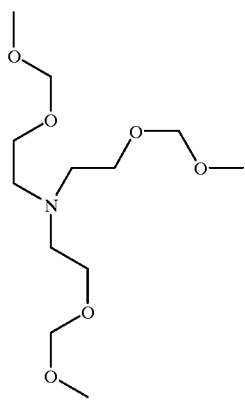

TMMEA

The resist solution was spin-coated onto the intermediate film, then baked at 100° C. for 90 seconds on a hot plate to give a resist film of 0.2 μm thick. The resist film was exposed using an KrF excimer laser stepper (Nikon Corporation; NA 0.60, 2/3 zone illumination), then baked (PEB) at 100° C. for 90 seconds, and developed for 60 seconds with a 2.38% aqueous solution of tetramethylammonium hydroxide (TMAH), thereby giving a positive pattern.

The sensitivity of the resist is the dose which provided a 0.20 μm line-and-space pattern in a line-to-space ratio of 1:1. The resolution is defined as the minimum line width (μm) of the lines and spaces that separated at this dose. The results are shown in Table 2.

The patterned two-layer resist film was etched by means of a parallel plate type sputter etching apparatus using oxygen gas as the etchant gas. The etching conditions included a gas flow rate of 50 sccm, a gas pressure of 1.3 Pa, an RF power of 50 watts, and a dc bias of 450 volts. The lower resist film was etched at a rate of 150 nm/min whereas the upper resist film was etched at a rate of less than 15 nm/min. After 5 minutes of etching, those portions of the lower resist film which were not covered with the upper resist film (of the inventive resist) disappeared completely. A two-layer resist pattern of 0.5 μm thick was formed.

TABLE 2

| Polymer (pbw) | Photoacid generator (pbw) | Basic compound (pbw) | Dissolution inhibitor/ crosslinker (pbw) | Sensitivity (mJ/cm$^2$) | Resolution (μm) |
|---|---|---|---|---|---|
| Polymer of SE 1 (100) | PAG1(2) | tributylamine (0.1) | — | 25 | 0.16 |
| Polymer of SE 2 (100) | PAG1(2) | tributylamine (0.1) | — | 20 | 0.17 |
| Polymer of SE 3 (100) | PAG1(2) | tributylamine (0.1) | — | 30 | 0.18 |
| Polymer of SE 4 (100) | PAG1(2) | tributylamine (0.1) | — | 28 | 0.18 |
| Polymer of SE 5 (100) | PAG1(2) | tributylamine (0.1) | — | 24 | 0.17 |
| Polymer of SE 6 (100) | PAG1(2) | tributylamine (0.1) | — | 21 | 0.18 |
| Polymer of SE 7 (100) | PAG1(2) | tributylamine (0.1) | — | 25 | 0.16 |
| Polymer of SE 8 (100) | PAG1(2) | tributylamine (0.1) | — | 22 | 0.16 |
| Polymer of SE 9 (100) | PAG1(2) | tributylamine (0.1) | — | 32 | 0.16 |
| Polymer of SE 10 (100) | PAG1(2) | tributylamine (0.1) | — | 33 | 0.16 |
| Polymer of SE 11 (100) | PAG1(2) | tributylamine (0.1) | — | 28 | 0.17 |
| Polymer of SE 12 (100) | PAG1(2) | tributylamine (0.1) | — | 24 | 0.16 |
| Polymer of SE 13 (100) | PAG1(2) | tributylamine (0.1) | — | 26 | 0.17 |
| Polymer of SE 14 (100) | PAG1(2) | tributylamine (0.1) | — | 23 | 0.16 |
| Polymer of SE 15 (100) | PAG1(2) | tributylamine (0.1) | — | 30 | 0.18 |
| Polymer of SE 16 (100) | PAG1(2) | tributylamine (0.1) | — | 30 | 0.17 |
| Polymer of SE 17 (100) | PAG1(2) | tributylamine (0.1) | — | 24 | 0.16 |
| Polymer of SE 18 (100) | PAG1(2) | tributylamine (0.1) | — | 23 | 0.17 |
| Polymer of SE 19 (100) | PAG1(2) | tributylamine (0.1) | — | 29 | 0.18 |
| Polymer of SE 20 (100) | PAG1(2) | tributylamine (0.1) | — | 22 | 0.16 |

TABLE 2-continued

| Polymer (pbw) | Photoacid generator (pbw) | Basic compound (pbw) | Dissolution inhibitor/ crosslinker (pbw) | Sensitivity (mJ/cm$^2$) | Resolution (μm) |
|---|---|---|---|---|---|
| Polymer of SE 21 (100) | PAG1(2) | tributylamine (0.1) | — | 21 | 0.16 |
| Polymer of SE 22 (100) | PAG1(2) | tributylamine (0.1) | — | 32 | 0.18 |
| Polymer of SE 23 (100) | PAG1(2) | tributylamine (0.1) | — | 21 | 0.15 |
| Polymer of SE 24 (100) | PAG1(2) | tributylamine (0.1) | — | 22 | 0.16 |
| Polymer of SE 25 (100) | PAG1(2) | tributylamine (0.1) | — | 26 | 0.17 |
| Polymer of SE 26 (100) | PAG1(2) | tributylamine (0.1) | — | 30 | 0.18 |
| Polymer of SE 27 (100) | PAG1(2) | tributylamine (0.1) | — | 26 | 0.16 |
| Polymer of SE 28 (100) | PAG1(2) | tributylamine (0.1) | — | 33 | 0.18 |
| Polymer of SE 29 (100) | PAG1(2) | tributylamine (0.1) | — | 33 | 0.17 |
| Polymer of SE 30 (100) | PAG1(2) | tributylamine (0.1) | — | 35 | 0.17 |
| Polymer of SE 1 (100) | PAG2(2) | tributylamine (0.1) | — | 12 | 0.18 |
| Polymer of SE 1 (100) | PAG1(2) | TMMEA (0.2) | — | 29 | 0.15 |
| Polymer of SE 1 (100) | PAG1(2) | tributylamine (0.1) | DRI1(20) | 22 | 0.16 |
| Polymer of CSE 1 (100) | PAG1(2) | tributylamine (0.1) | — | 38 | 0.17 |
| Polymer of CSE 2 (100) | PAG1(2) | tributylamine (0.1) | — | pattern did not form because developer repelled | — |

As seen from Table 2, the polymers bearing silicon-containing substituent groups according to the invention exhibit high transparency down to the ArF wavelength, no repellency to the developer, and a high resolution as long as they are derived from (meth)acrlylic acids and norbornenecarboxylic acids, except for substituted styrenes.

Japanese Patent Application No. 11-342380 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A polymer bearing cyclic silicon-containing groups of the following formula (1) or (2):

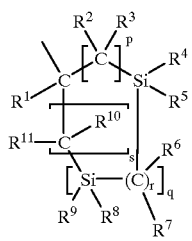

(1)

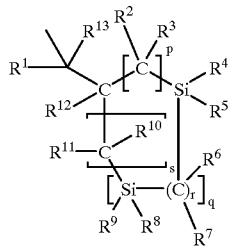

(2)

wherein $R^1$ is straight, branched or cyclic alkyl group of 1 to 20 carbon atoms, $R^2$, $R^3$, $R^6$, $R^7$, $R^{10}$, $R^{11}$, $R^{12}$, and $R^{13}$ are independently hydrogen or straight, branched or cyclic alkyl groups of 1 to 20 carbon atoms, $R^4$, $R^5$, $R^8$, and $R^9$ are independently hydrogen, straight, branched or cyclic alkyl groups of 1 to 20 carbon atoms, fluorinated alkyl groups of 1 to 20 carbon atoms, or aryl groups of 6 to 20 carbon atoms, and p, q, r and s are integers of 0 to 10, and $1 \leq p+q+s \leq 20$.

2. The polymer of claim 1 comprising recurring units of at least one of the following general formulas (3) to (8):

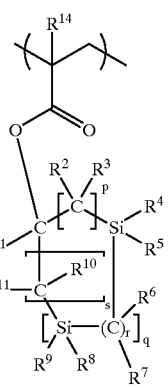

(3)

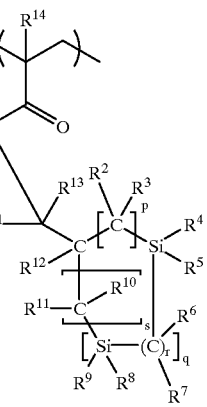

(4)

(5)

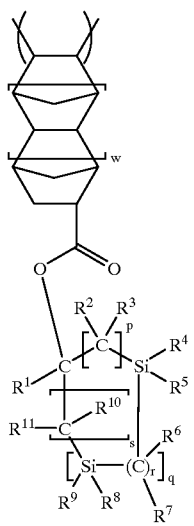

(6)

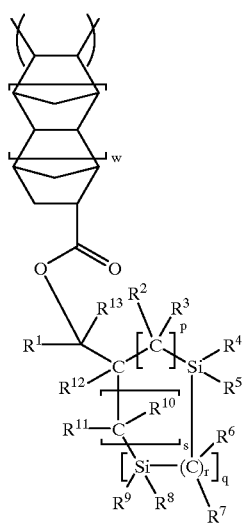

(7)

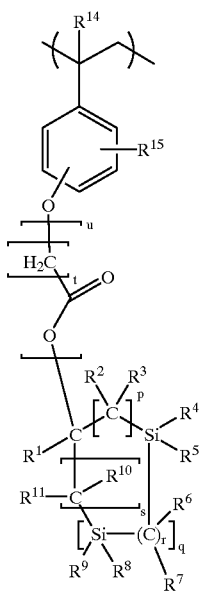

(8)

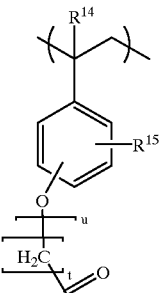

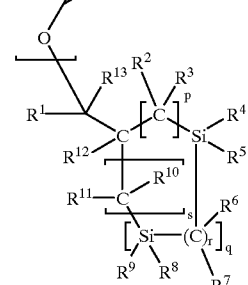

wherein $R^1$ through $R^{13}$, p, q, r and s are as defined above, $R^{14}$ is hydrogen or a straight, branched or cyclic alkyl group of 1 to 20 carbon atoms, $R^{15}$ is hydrogen or an alkyl group of 1 to 10 carbon atoms, t is a number of 0 to 5, u is equal to 0 or 1, and w is a number of 0 to 5.

3. A polymer according to claim 1 wherein the alkyl groups independently have 1 to 10 carbon atoms, and the aryl groups independently have 6 to 12 carbon atoms.

4. A polymer according to claim 1, further comprising units which may be the same or different which contain one or more hydrophilic substituent groups.

5. A polymer according to claim 1, wherein p, q, r and s are integers of 0 to 8, and $1 \leq p+q+s \leq 10$.

6. A polymer according to claim 1, wherein p, q, r and s integers of 0 to 6, and $1 \leq p+q+s \leq 8$.

7. A polymer according to claim 1, wherein $R^1$ is methyl, ethyl, or isopropyl.

8. A chemically amplified positive resist composition comprising (A) a polymer bearing cyclic silicon-containing groups of the following formula (1) or (2):

(1)

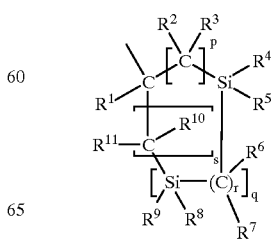

(2)

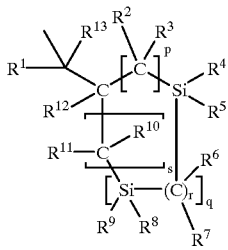

wherein $R^1$, $R^2$, $R^3$, $R^6$, $R^7$, $R^{10}$, $R^{11}$, $R^{12}$, and $R^{13}$ are independently hydrogen or straight, branched or cyclic alkyl groups of 1 to 20 carbon atoms, $R^4$, $R^5$, $R^8$, and $R^9$ are independently hydrogen, straight, branched or cyclic alkyl groups of 1 to 20 carbon atoms, fluorinated alkyl groups of 1 to 20 carbon atoms, or aryl groups of 6 to 20 carbon atoms, and p, q, r and s are integers of 0 to 10, and $1 \leq p+q+s \leq 20$, (B) a photoacid generator, and (C) an organic solvent.

9. The chemically amplified positive resist composition of claim 8 further comprising (E) a basic compound.

10. A method for forming a resist pattern, comprising the steps of:
    (1) applying the resist composition of claim 8 onto an organic film on a substrate and baking the composition to form a resist film,
    (2) irradiating radiation to the resist film through a photomask,
    (3) optionally baking the resist film and then developing the resist film with an aqueous base solution for dissolving the irradiated area of the resist film until the underlying organic film is exposed, thereby forming a resist pattern, and
    (4) processing the exposed area of the organic film with an oxygen plasma generated by a dry etching apparatus.

11. A method according to claim 10, wherein $R^1$ is straight, branched or cyclic alkyl group of 1 to 20 carbon atoms.

12. The chemically amplified positive resist composition of claim 8 wherein the polymer (A) comprises recurring units of at least one of the following formulas (3) to (8):

(3)

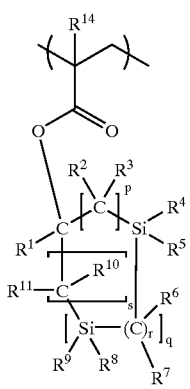

(4)

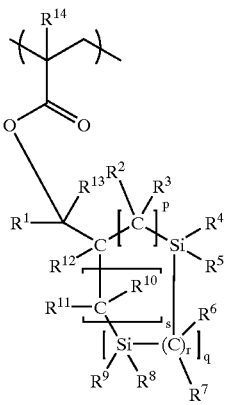

(5)

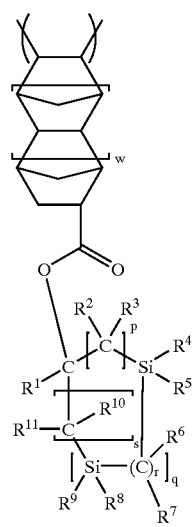

(6)

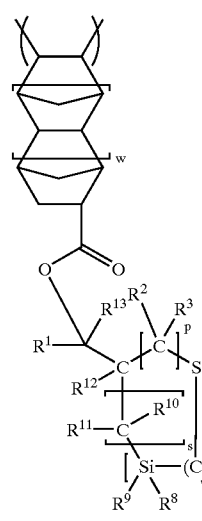

-continued (7)

[chemical structure]

(8)

[chemical structure]

wherein $R^1$ through $R^{13}$, p, q, r and s are as defined above, $R^{14}$ is hydrogen or a straight, branched or cyclic alkyl group of 1 to 20 carbon atoms, $R^{15}$ is hydrogen or an alkyl group of 1 to 10 carbon atoms, t is a number of 0 to 5, u is equal to 0 or 1, and w is a number of 0 to 5.

13. A resist composition according to claim 8 wherein $R^1$ is a straight, branched or cyclic alkyl group of 1 to 20 carbon atoms.

14. A chemically amplified positive resist composition comprising (A) a polymer bearing cyclic silicon-containing groups of the following (1) or (2):

(1)

[chemical structure]

(2)

[chemical structure]

wherein $R^1$, $R^2$, $R^3$, $R^6$, $R^7$, $R^{10}$, $R^{11}$, $R^{12}$, and $R^{13}$ are independently hydrogen or straight, branched or cyclic alkyl groups of 1 to 20 carbon atoms, $R^4$, $R^5$, $R^8$, and $R^9$ are independently hydrogen, straight, branched or cyclic alkyl groups of 1 to 20 carbon atoms, fluorinated alkyl groups of 1 to 20 carbon atoms, or aryl groups of 6 to 20 carbon atoms, and p, q, r and s are integers of 0 to 10, and $1 \leq p+q+s \leq 20$, (B) a photoacid generator, (C) an organic solvent, and (D) a dissolution inhibitor having an acid labile group.

15. The chemically amplified positive resist composition of claim 14 further comprising (E) a basic compound.

16. A method for forming a resist pattern, comprising the steps of:

(1) applying the resist composition of claim 14, onto an organic film on a substrate and baking the composition to form a resist film, (2) irradiating the resist film through a photomask, (3) optionally baking the resist film and then developing the resist film with an aqueous base solution for dissolving the irradiated area of the resist film until the underlying organic film is exposed, thereby forming a resist pattern, and (4) processing the exposed area of the organic film with an oxygen plasma generated by a dry etching apparatus.

17. A method according to claim 16, wherein $R^1$ is a straight, branched or cyclic alkyl group of 1 to 20 carbon atoms.

18. The chemically amplified positive resist composition of claim 14 wherein the polymer (A) comprises recurring units of at least one of the following formulas (3) to (8):
(3)
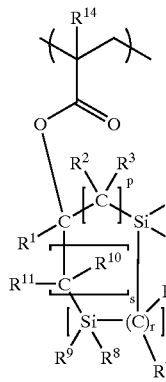
(4)
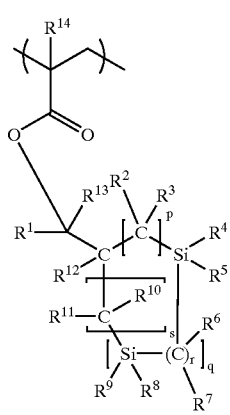
(5)
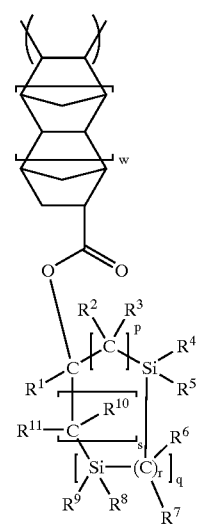
-continued
(6)
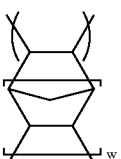
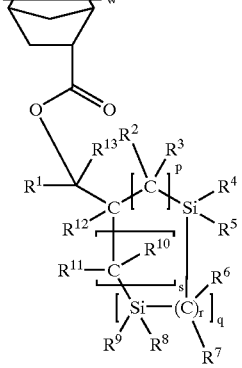
(7)
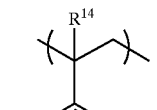
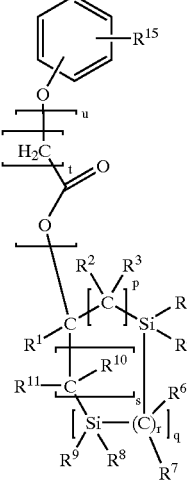
(8)
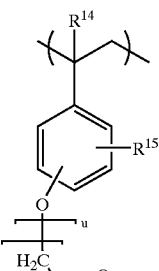
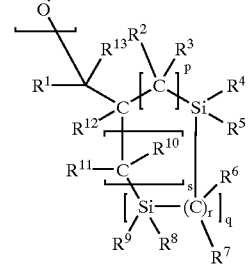

wherein $R^1$ through $R^{13}$, p, q, r and s are as defined above, $R^{14}$ is hydrogen or a straight, branched or cyclic alkyl group of 1 to 20 carbon atoms, $R^{15}$ is hydrogen or an alkyl group of 1 to 10 carbon atoms, t is a number of 0 to 5, u is equal to 0 or 1, and w is a number of 0 to 5.

19. A resist composition according to claim 14 wherein $R^1$ is a straight, branched or cyclic alkyl group of 1 to 20 carbon atoms.

* * * * *